(12) United States Patent
Yang et al.

(10) Patent No.: US 12,707,958 B2
(45) Date of Patent: Aug. 11, 2026

(54) TUNABLE W-SHAPED PROFILE FOR STRUCTURES

(71) Applicant: Taiwan Semiconductor Manufacturing Company, Ltd., Hsinchu (TW)

(72) Inventors: Jih-Sheng Yang, Hsinchu (TW); Li-Wei Yin, Hsinchu (TW); Yu-Hsien Lin, Kaohsiung (TW); Tzu-Wen Pan, Hsinchu (TW); Shih-Chieh Chao, Taichung (TW); Chia Ming Liang, Taipei (TW); Yih-Ann Lin, Hsinchu (TW); Ryan Chia-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 536 days.

(21) Appl. No.: 18/189,850

(22) Filed: Mar. 24, 2023

(65) Prior Publication Data

US 2024/0321739 A1 Sep. 26, 2024

(51) Int. Cl.

| | |
|---|---|
| ***H10W 20/41*** | (2026.01) |
| ***H10D 64/01*** | (2025.01) |
| ***H10P 50/64*** | (2026.01) |
| ***H10W 20/00*** | (2026.01) |

(52) U.S. Cl.
CPC ........ *H10W 20/435* (2026.01); *H10D 64/017* (2025.01); *H10P 50/642* (2026.01); *H10W 20/037* (2026.01); *H10W 20/056* (2026.01)

(58) Field of Classification Search
CPC ........... H01L 23/5283; H01L 21/30604; H01L 21/02115; H01L 21/02126; H01L 21/32139; H10D 64/017; H10D 64/518; H10W 20/037; H10W 20/056; H10W 20/069; H10W 20/077; H10W 20/435; H10P 50/642
See application file for complete search history.

(56) References Cited

U.S. PATENT DOCUMENTS

2014/0367801 A1* 12/2014 Liu .................. H01L 21/02244 257/407
2024/0120388 A1* 4/2024 Yin .................. H01L 21/32139

* cited by examiner

*Primary Examiner* — John M Parker
(74) *Attorney, Agent, or Firm* — Ingrassia Fisher & Lorenz, LLP | IF&L

(57) ABSTRACT

Provided are structures and methods for forming structures with surfaces having a W-shaped profile. An exemplary method includes differentially etching a gate material to a recessed surface including a first and second horn and a valley located therebetween including first and second sections and a middle section therebetween; depositing an etch-retarding layer over the recessed surface including first and second edge regions and a central region therebetween, wherein the first edge region is located over the first horn and the first section, the second edge region is located over the second horn and the second section, the central region is located over the middle region, and the central region is thicker than the first edge region and the second edge region; and performing an etch process to recess the horns to establish the gate material with a W-shaped profile.

20 Claims, 12 Drawing Sheets

TUNABLE W-SHAPED PROFILE FOR STRUCTURES

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
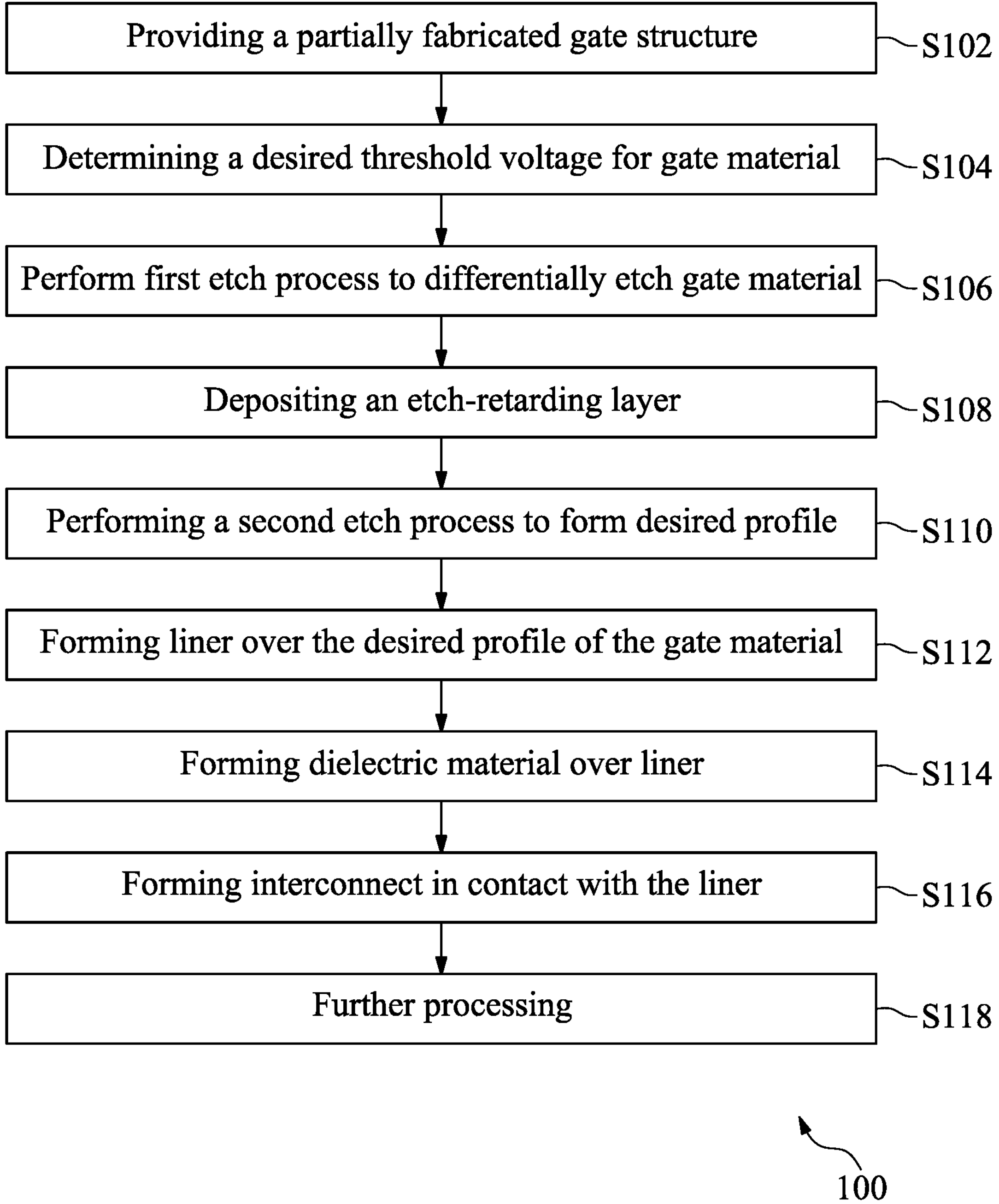
FIG. 1 is a flow chart illustrating a method, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. As used herein, "directly over" refers to a vertical alignment of features such that when an overlying feature that is directly over an underlying feature, a vertical axis passes through both features. In addition, the present disclosure may repeat reference numerals and/or letters in the various examples. This repetition is for the purpose of simplicity and clarity and does not in itself dictate a relationship between the various embodiments and/or configurations discussed.

As used herein, "positive slope" and "negative slope" refer to the typical reference system in which a positive slope is defined by an increase in a vertical or Z direction with an increase in the lateral or Y direction and a negative slope is defined by an decrease in a vertical or Z direction with an increase in the lateral or Y direction.

Further, spatially relative terms, such as "directly over", "over", "overlying", "above", "upper", "top", "under", "underlying", "beneath", "below", "lower", "bottom", "side", "positive slope" and "negative slope" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

As described herein, an etching process is used to form a conductive gate with a desired profile. For example, in certain embodiments it may be desirable to increase the interfacial contact area between two layers, i.e., the area of surface contact. The interfacial contact area can be increased without increasing the footprint area defined by the lateral X dimension and longitudinal Y dimension by providing a first layer with a non-horizontally planar profile, i.e., a sloping profile with an increase and/or decrease in the vertical Z dimension, and then conformally depositing the second layer over the first layer.

Further, in certain embodiments, it may be desirable to increase the contact area between an interconnect and conductive layer. Again, the contact area can be increased without increasing the footprint area of the interconnect defined by the lateral Y dimension and longitudinal X dimension by providing a non-horizontally planar contact interface, i.e., a sloping contact interface with an increase and/or decrease in the vertical Z dimension.

Embodiments of the present disclosure offer advantages over the existing art, though it is understood that other embodiments may offer different advantages, not all advantages are necessarily discussed herein, and no particular advantage is required for all embodiments. For example, embodiments discussed herein include conductive gate structures and related methods for processing metal gate structures to provide conductive interconnections. In certain embodiments, a metal gate etch back in-situ etch-deposition-etch process is performed to provide a tunable line end horn profile to improve WAT.

In various embodiments, an initial etching process is performed to recess the metal gate structure to a recessed surface that is non-planar. More specifically, in certain embodiments, the recessed surface has a central valley from which the recessed surface extends outward (in the Y-direction) and upward (in the Z-direction) to terminal horns. In order to tune the threshold voltage of the gate material, further etching process is performed in exemplary embodiments. For example, an etch-retarding layer is deposited over the recessed surface. In exemplary embodiments, the etch-retarding layer is formed with a greater thickness over the central valley and with a smaller thickness over the terminal horns. Thereafter, a second etch process is performed. The second etch process can be controlled to remove the thin portions of the etch-retarding layer and then selectively etch the terminal horns while the central valley region is still covered by the etch-retarding layer. As a result, the process can be controlled to trim the terminal horns to a desired profile. Thus, the process provides for threshold voltage tuning by line end horn thickness. Further, the central valley may be selectively etched to varying depths as a result of the varying thickness of the etch-retarding layer. Thus, the gate structure surface may be formed with a W-shaped profile, having a first raised terminal horn, a first valley, a middle peak, a second valley, and a second raised terminal horn. Also, the effective gate length is increased due to the W-shape of the profile and provides more contact area between the metal gate and the overlying layer to reduce channel resistance (Rg). Further, as the height differential of surface features increases, the contact area with a later-formed conducive interconnect increases, and the contact resistance (Rc) is reduced.

For purposes of the discussion that follows, FIG. 1 provides a flow chart of a method 100, in accordance with various embodiments. Method 100 is discussed below with reference to a gate such as a metal gate formed in a replacement gate process. However, it will be understood that aspects of method 100 may be equally applied to other types of structures without departing from the scope of the present disclosure. It is understood that method 100 includes steps having features of a complementary metal-oxide-semiconductor (CMOS) technology process flow and thus, are only described briefly herein. Also, additional steps may be performed before, after, and/or during method 100.

Method 100 is described below with initial reference to FIG. 2, which illustrates a plan layout view of the semiconductor device 200, and to FIGS. 3-8 which illustrate the semiconductor device 200 at various stages of fabrication according to method 100. FIGS. 3-8 provide cross-sectional views of an embodiment of the semiconductor device 200.

Figure 2:
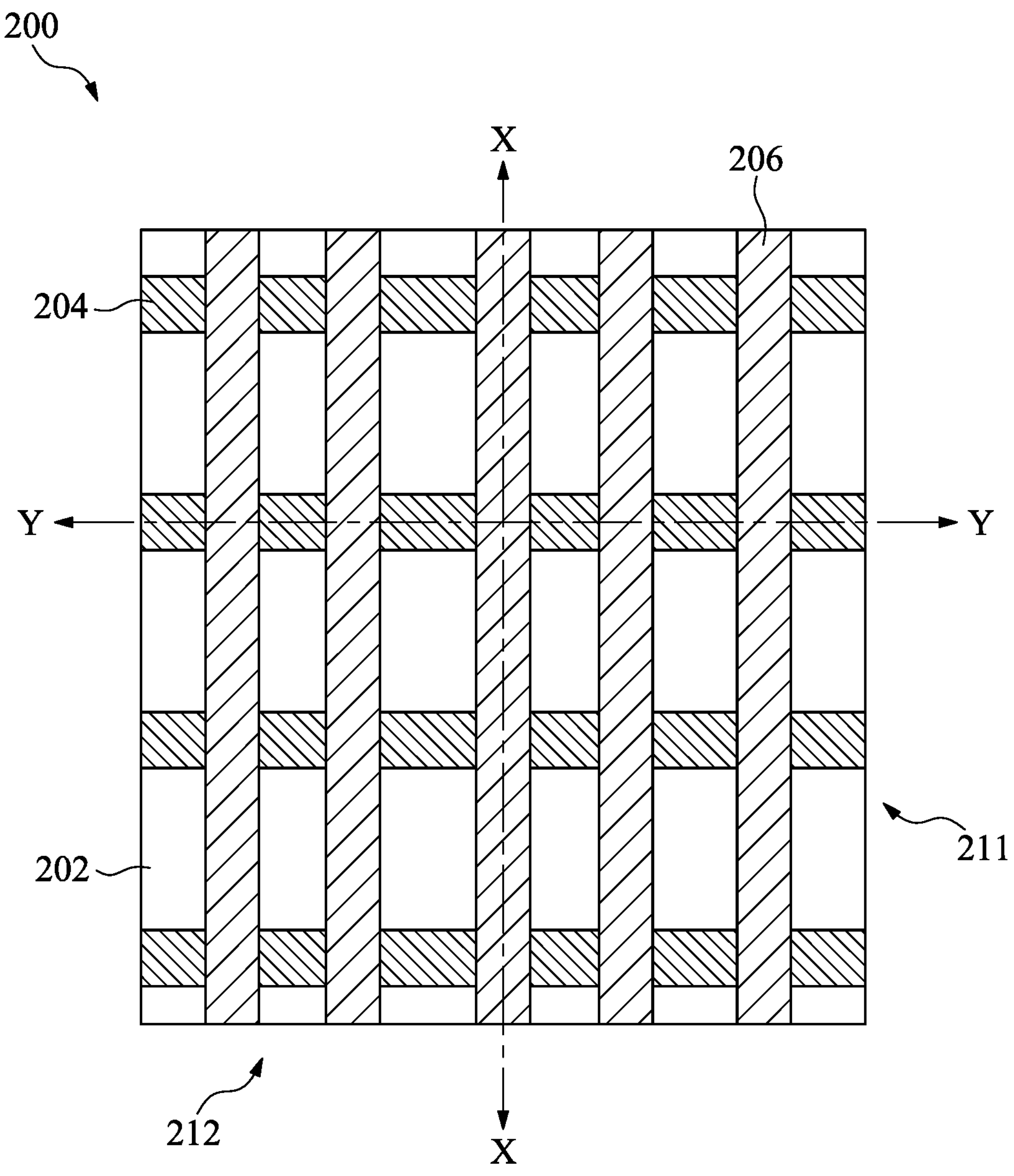
FIG. 2 is a plan layout view of a semiconductor device, in accordance with some embodiments.
Figure 3:
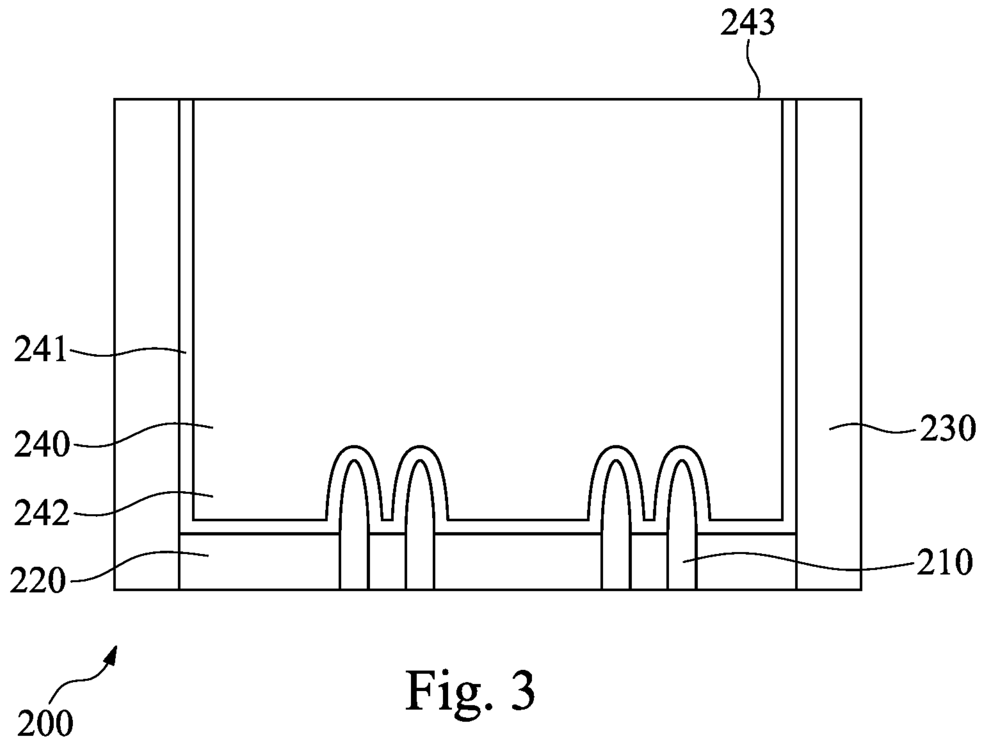
FIGS. 3-8 are cross-sectional views of a structure of the semiconductor device during successive stages of fabrication, in accordance with some embodiments.

As shown in FIG. 2, the semiconductor device 200 includes a substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epi layer, may be strained for performance enhancement, may include a silicon-on-insulator (SOI) structure, and/or have other suitable enhancement features.

In exemplary embodiments, source/drain regions or active regions 204 are formed in or over the substrate 202. Exemplary active regions 204 are parallel and, in the orientation of the Figures, extend in the Y-direction. In various examples, the source/drain features 204 include semiconductor epi layers such as Ge, Si, GaAs, AlGaAs, SiGe, GaAsP, SiP, or other suitable material, which may be formed by one or more epitaxial processes. In some embodiments, the source/drain features 204 may be in-situ doped during the epi process. For example, in some embodiments, epitaxially grown SiGe source/drain features may be doped with boron. In some cases, epitaxially grown Si source/drain features may be doped with carbon to form Si:C source/drain features, phosphorous to form Si:P source/drain features, or both carbon and phosphorous to form SiCP source/drain features. In some embodiments, the source/drain features 204 are not in-situ doped, and instead an implantation process is performed to dope the source/drain features 204. In some embodiments, formation of the source/drain features 204 may be performed in separate processing sequences for each of N-type and P-type source/drain features.

As shown in FIG. 2, the device 200 further includes gate structures 206. In exemplary embodiments, the gate structures 206 are parallel and, in the orientation of the Figures, extend in the X-direction. As shown in FIG. 2, the device 200 includes various device areas, such as area 211 and area 212.

It is contemplated that the gate structures may be part of a fin field-effect transistor (FinFET) a gate-all-around (GAA) transistor, or other type of multi-gate device. Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the concepts of the present disclosure. In some embodiments, the semiconductor device 200 includes a plurality of semiconductor devices (e.g., transistors), including PMOS devices, NMOS devices, etc., which may be interconnected. Moreover, it is noted that the process steps of method 100, including any descriptions given with reference to the figures are merely exemplary and are not intended to be limiting beyond what is specifically recited in the claims that follow.

It is understood that method 100 includes steps having features of a complementary metal-oxide-semiconductor (CMOS) technology process flow and thus, are only described briefly herein. Also, additional steps may be performed before, after, and/or during method 100.

Method 100 begins at block S102 where a partially fabricated gate structure is provided. Referring to the example of FIG. 3, in an embodiment of block S102, the partially fabricated device 200 includes active regions 210. Active regions 210 may be the upper ends of three-dimensional fins of semiconductor material formed from substrate 202 of FIG. 1.

Shallow trench isolation (STI) features 220 may also be formed interposing the active regions 210. In some embodiments, the STI features 220 include $SiO_2$, silicon nitride, silicon oxynitride, fluorine-doped silicate glass (FSG), a low-k dielectric, combinations thereof, and/or other suitable materials known in the art. In various examples, the dielectric layer used to form the STI features may be deposited by a CVD process, a subatmospheric CVD (SACVD) process, a flowable CVD process, an ALD process, a PVD process, and/or other suitable process.

A gate structure 240 is formed over the active regions 210. In the illustrated embodiment, the gate structure 240 includes a layer 241 and a conductive metal 242 in a high-K/metal gate stack or plug.

An exemplary layer 241 is a high-K gate dielectric. High-K gate dielectrics, as used and described herein, include dielectric materials having a high dielectric constant, for example, greater than that of thermal silicon oxide (about 3.9). An exemplary high-K gate dielectric layer 241 may include a high-K dielectric material such as hafnium oxide ($HfO_2$). Alternatively, the high-K gate dielectric layer 241 may include other high-K dielectric materials, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$. $Si_3N_4$, oxynitrides (SiON), combinations thereof, or other suitable material. The high-K gate dielectric layer 241 may be formed by atomic layer deposition (ALD), physical vapor deposition (PVD), chemical vapor deposition (CVD), oxidation, and/or other suitable methods.

The gate structure 240 may further include a metal gate material 242 formed over the gate dielectric layer 241. The metal layer 242 may include a metal, metal alloy, or metal silicide. The metal layer 242 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 242 may include Al, Ti, Ag, TiAlN, TaC, TaCN, TaSiN, Mn, Zr, TiN, TaN, Ru, Mo, W, WN, Cu, Re, Ir, Co, Ni, other suitable metal materials or a combination thereof. In various embodiments, the metal layer 242 may be formed by ALD, PVD, CVD, e-beam evaporation, or other suitable process. Further, the metal layer 242 may be formed separately for N-type and P-type transistors which may use different metal layers. In addition, the metal layer 242 may provide an N-type or P-type work function material, may serve as a transistor gate electrode, and in at least some embodiments, the metal layer 242 may include a polysilicon layer.

As further shown, a spacer layer 230 may be formed on the sidewalls of the gate structure 240. The spacer layer 230 may be formed prior to formation of the high-K/metal gate stack of the gate structure. For example, in some cases, the spacer layer 230 may be formed on sidewalls of a previously formed dummy (sacrificial) gate stack that is removed and replaced by the high-K/metal gate stack as part of a replacement gate (gate-last) process. In some cases, the spacer layer 230 may have a thickness of from 2 to 10 nanometers (nm). In some examples, the spacer layer 230 may include a dielectric material such as silicon oxide, silicon nitride, silicon carbide, silicon oxynitride, SiCN, silicon oxycarbide, SiOCN, SiOHCN, a low-K material (e.g., with a dielectric constant 'k'<7), and/or combinations thereof. In some embodiments, the spacer layer 230 includes multiple layers, such as main spacer layers, liner layers, and the like.

Thus, block S102 may include performing a replacement gate process including removing a sacrificial gate structure to form a cavity, depositing gate material in the cavity, and planarizing the metal gate material to define a planar upper surface 243 of the gate structure 240.

Method 100 further includes, at block S104, determining a desired threshold voltage for the gate material. Such determination may be made based on the intended use of the gate, location in a NMOS device or PMOS device, the dimensions and materials of the gate structure, and the dimensions and material of the layers to be formed over the gate and/or interconnected to the gate. Based on the determination of the desired threshold voltage, a desired profile of the gate material is selected.

Method 100 may continue at block S106, with performing a first etch process to differentially etch the gate material. As shown, in FIG. 4, the etch process recesses the gate structure 240 to a recessed surface 250. As shown the recessed surface 250 includes a central valley 251 and extends outward and upward to a first terminal horn 252 at a first edge 262 of the gate structure 240 and to a second terminal horn 253 at a second edge 263 of the gate structure 240. More specifically, the central valley 251 of the recessed surface includes a first valley section 2512 adjacent to the first terminal horn 252, a second valley section 2513 adjacent to the second terminal horn 253, and a middle valley section 2511 located between the first valley section 2512 and the second valley section 2513.

In exemplary embodiments, the etch is a dry etch and may be performed with a $BCl_3/Cl_2/O_2$ gas, at a pressure of from 1 to 200 mTorr, at a power of from 400 to 1200 W, and with a bias of from 0 to 100 W. While this etch processes is described, other suitable etching processes may be used.

Figure 5:
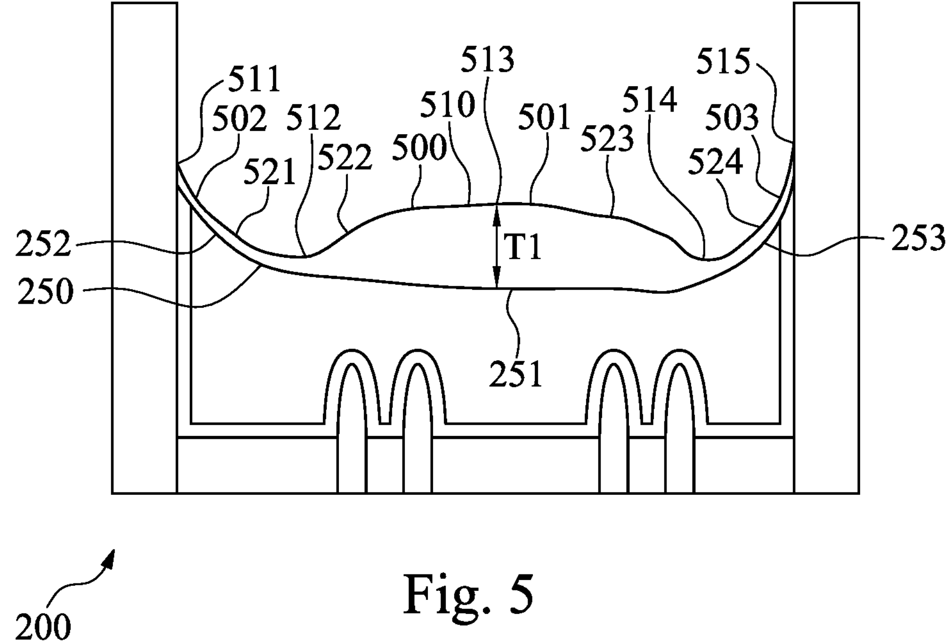

Method 100 may continue at block S108, with depositing an etch-retarding layer 500 over the recessed surface 250. As shown in FIG. 5, the etch-retarding layer 500 is formed with a central region 501 located between edge regions 502 and 503. Specifically, the central region 501 is located directly over the central valley 251, the edge region 502 is located directly over the horn 252, and the edge region 503 is located directly over the horn 253. More specifically, the first edge region 502 is located over the first horn 252 and over the first valley section 2512; the second edge region 503 is located over the second horn and over the second valley section 2513; and the central region 501 is located over the middle valley section 2511.

An exemplary etch-retarding layer 500 is formed with a non-uniform thickness including a minimum thickness at a thin region and a maximum thickness at a thick region. For example, as shown, the central region 501 of the etch-retarding layer is thicker than the edge regions 502 and 503 of the etch-retarding layer 500, such that the central region 501 is a thick region 501 and the edge regions 502 and 503 are thin regions 502 and 503. As shown, the etch-retarding layer 500 has a maximum vertical thickness T1 in the central region 501. In exemplary embodiments, the maximum vertical thickness T1 may be at least 1.1, at least 1.25, at least 1.5, at least 1.75, at least 2.0, at least 2.25, at least 2.5, at least 2.75, at least 3.0, at least 3.25, at least 3.5, at least 3.75, at least 4.0, at least 4.25, at least 4.5, at least 4.75, at least 5.0, at least 5.25, at least 5.5, at least 5.75, at least 6.0, at least 6.25, at least 6.5, at least 6.75, at least 7.0, at least 7.25, at least 7.5, at least 7.75, or at least 8.0 times greater than the vertical thickness of the edge regions 502 and 503 as measured at the interface of the dielectric 241 and the gate material 242.

The etch-retarding layer 500 has an upper surface 510 that extends from an end 511 to a trough 512, from the trough 512 to a crest 513, from the crest to a trough 514, and from the trough 514 to an end 515. Thus, the upper surface 510 includes a section with a negative slope 521, a section with a positive slope 522, a section with a negative slope 523, and a section with a positive slope 524.

It may be seen that the etch-retarding layer 500 has a maximum vertical thickness T1 at the crest 513. Generally, the vertical thickness of the etch-retarding layer increases in the positive slope section 522 from the trough 512 to the crest 513 and decreases from the crest 513 to the trough 514. In certain embodiments, the first edge region 502 of the etch-retarding layer 500 includes the negative slope section 521 of the upper surface 510; the central region 501 of the etch-retarding layer 500 includes the positive slope section 522 and the negative slope section 523 of the upper surface 510; and the second edge region 503 of the etch-retarding layer 500 includes the positive slope section 524 of the upper surface 510.

In exemplary embodiments, the etch-retarding layer comprises carbon, boron, or carbon and boron.

An exemplary etch-retarding layer 500 may be formed with a process performed with $BCl_3/CH_4/HBr$ gas or $SiCl_4/O_2/HBr$ gas, at a pressure of from 10 to 200 mTorr, at a power of from 400 to 1200 W, and with a bias of from 0 to 20 W. While these process parameters are identified, other suitable processes may be used.

It is noted that a desired profile of the upper surface 510 of the etch-retarding layer 500 may be obtained by controlling the duration of the deposition process. Likewise, a desired maximum vertical thickness T1 of the etch-retarding layer 500 may be obtained by controlling the duration of the deposition process. For example, a shorter deposition time may result in a smaller maximum vertical thickness T1 and a longer deposition time may result in a larger maximum vertical thickness T1, relative to one another.

Figure 4:
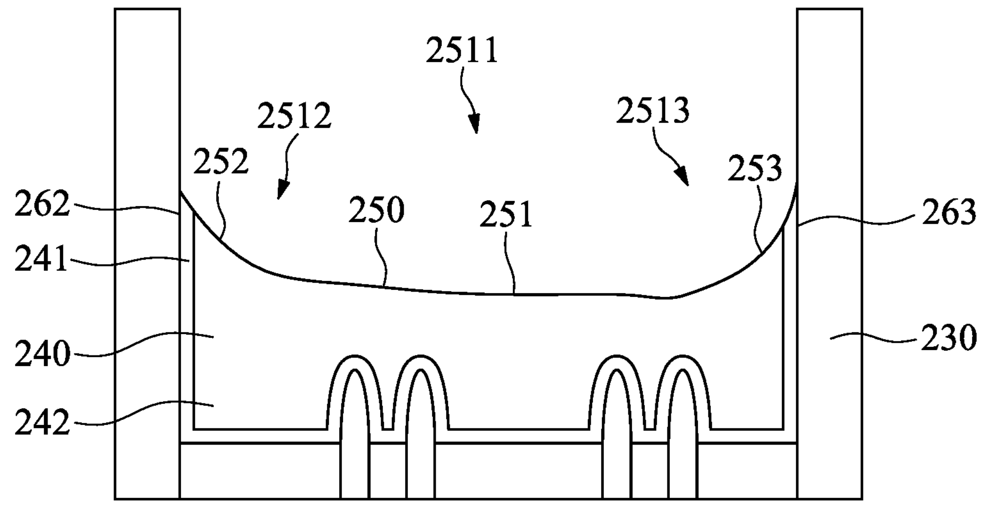

Cross-referencing FIGS. 4, and 5, it may be seen that the end 511 of the upper surface 510 is located at the first edge 262 of the gate structure 240 and the end 515 of the upper surface 510 is located at the second edge 263 of the gate structure 240. Further, the trough 512 is located directly over, i.e., vertically over, the boundary between the first valley section 2512 and the middle valley section 2511; the crest 513 is located directly over, i.e., vertically over, the middle valley section 2511; and the trough 514 is located directly over, i.e., vertically over, the boundary between the second valley section 2513 and the middle valley section 2511.

Figure 6:
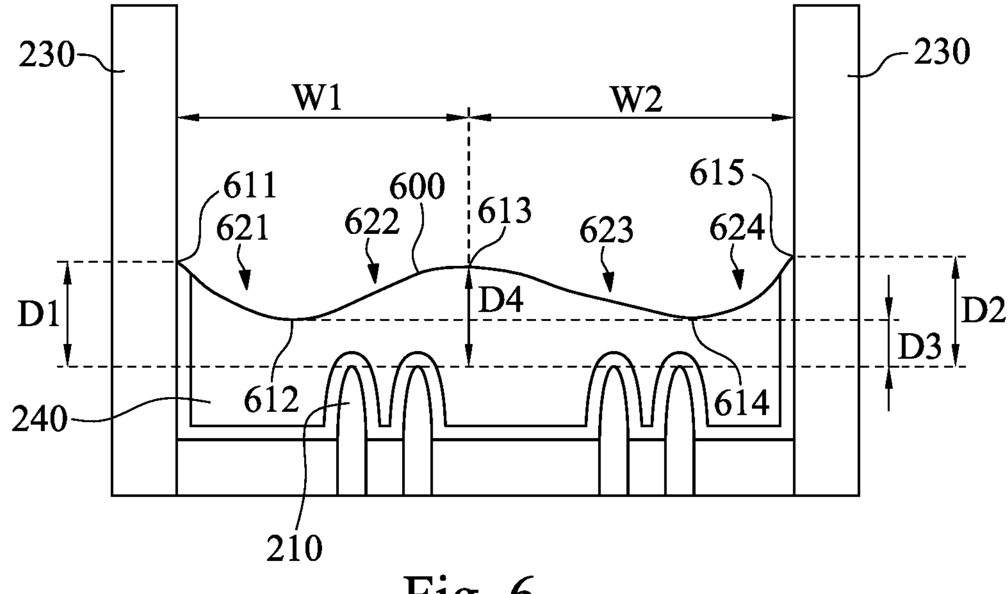

At action block S110, method 100 includes performing a second etch process to establish the gate structure 240 with an upper surface 600 of the desired profile, such as with a W-shaped profile as shown in FIG. 6. In exemplary embodiments, the second etch process recesses or trims the horns 252 and 253. In exemplary embodiments, the second etch process is controlled to selectively recess portions of the central valley 251 of the recessed surface 250 to form the upper surface 600 having a desired W-shaped profile. For example, the first valley section 2512 and the second valley section 2513 may be etched to a depth greater than the middle valley section 2511 such that the middle valley section 2511 remains at a height greater than the first valley section 2512 and the second valley section 2513.

As shown in FIG. 6, the second etch process forms the upper surface 600 with a first end 611 adjacent the spacer layer 230, a first trough or nadir 612, a crest 613, a second trough or nadir 614, and a second end 615 adjacent the spacer layer 230. As shown, the first end 611 is formed at a vertical distance or horn height D1 over the top of the active areas 210. Further, the second end 615 is formed at a vertical distance or horn height D2 over the top of the active areas 210. Horn heights D1 and D2 may be the same or may be different. In the illustrated embodiment, the first trough 612 and the second trough 614 are both formed at a same vertical distance or trough height D3 over the top of the active areas 210. However, it is not necessary to etch the troughs 612 and 614 to the same height over the top of the active areas 210. As further, shown, the crest 613 is formed at a vertical distance or crest height D4 over the top of the active areas 210. In the illustrated embodiment, crest height D4 is less than horn heights D1 and D2; however, it is contemplated that crest height D4 may be greater than one or both of horn heights D1 and D2.

A vertical height differential ΔD14, equal to the difference of D1 and D4, is established between the end 611 and the crest 613. A vertical height differential ΔD24, equal to the difference of D2 and D4, is established between the end 615 and the crest 613. A vertical height differential ΔD43, equal to the difference of D4 and D3, is established between the crest 613 and the troughs 612 and 614. A vertical height differential ΔD13, equal to the difference of D1 and D3, is established between the end 611 and the trough 612. A vertical height differential ΔD23, equal to the difference of D2 and D3, is established between the end 615 and the trough 614.

In exemplary embodiments for an upper surface 600 having a W-shaped profile, heights D1 and D2 are independently from 10 to 30 nm. In exemplary embodiments, heights D3 are independently from 5 to 15 nm. In exemplary embodiments, height D4 is from 20 to 25 nm. In the raised valley middle section, the height of the upper surface 600 increases from the trough height D3 to the crest height D4, thus each location on the upper surface 600 in the valley middle section is at a height of from 5 to 25 nm over the active regions. In exemplary embodiments, height differential ΔD14 and ΔD24 are independently from −10 to 15 nm, height differential ΔD43 is from 10 to 20 nm, and height differentials ΔD13 and ΔD23 are independently from −5 to 25 nm.

As shown in FIG. 6, the gate structure 240 is formed with a lateral width or distance W1 from the first end 611 to the crest 613 and with a lateral width or distance W2 from the second end 615 to the crest 613. In exemplary embodiments, lateral width W1 and lateral width W2 are independently from 40 to 60 nm.

In certain embodiments, the second etch is a dry etch. In certain embodiments, the second etch is a dry etch performed with $CF_4/O_2/N_2$, $NF_3/O_2/N_2$, or $BCl_3/Cl_2/O_2$ gas, at a pressure of from 1 to 200 mTorr, at a power of from 400 to 1200 W, and with a bias of from 0 to 20 W. While these etch processes are described, other suitable etching processes may be used.

In order to achieve the desired W-shaped profile of the gate, the duration and conditions of the second etch may be controlled. In FIG. 6, the second etch is performed for a relatively short duration, resulting in generally larger horns with raised ends 611 and 615 at a relatively greater maximum height and a middle peak with a raised crest 613 at a relatively greater maximum height D4. Such embodiments have less gate metal loss, and a lower threshold voltage for a NMOS device, but a higher threshold voltage for a PMOS device.

In the illustrated embodiment, after the second etch is performed, the upper surface 600 extends from end 611 to trough 612, from trough 612 to crest 613, from crest 613 to trough 614, and from trough 614 to end 615. Thus, the upper surface 600 includes a section with a negative slope 621, a section with a positive slope 622, a section with a negative slope 623, and a section with a positive slope 624. In exemplary embodiments, negative slope section 621 has a steepest slope of −45°, positive slope section 622 has a steepest slope of 45°, negative slope section 623 has a steepest slope of −45°, and positive slope section 624 has a steepest slope of 45°. Each section 621, 622, 623, and 624 has a flattest slope of 0° at the respective trough or crest. In exemplary embodiments, the negative slope section 621 has a slope of from −5° to −45° and the positive slope section 624 has a slope of from 5° to 45°. In exemplary embodiments, the absolute value difference in slope between the negative slope section 621 and the positive slope section 624 is from 0 to 20°. In exemplary embodiments, the negative slope section 623 has a slope of from −5° to −45° and the positive slope section 622 has a slope of from 5° to 45°. In exemplary embodiments, the absolute value difference in slope between the negative slope section 623 and the positive slope section 622 is from 0 to 20°.

It is noted that a desired profile of the upper surface 600 may be obtained by controlling the duration of the processes for depositing the etch-retarding layer 500 and for performing the second etch of the etch-retarding layer 500 and the gate structure 240. For example, the etch process may be performed for a relatively longer period of time to form the upper surface 600 with a profile having equal heights D1, D2, D3, and D4 and with height differentials ΔD14, ΔD24, ΔD43, ΔD13, and/or ΔD23 all equal to zero, i.e., a planar and horizontal upper surface 600. On the other hand, the etch process may be performed for a relatively shorter period of time to form the upper surface 600 with a profile having desired heights D1, D2, D3, and D4 and with increased or maximized height differentials ΔD14, ΔD24, ΔD43, ΔD13, and/or ΔD23, i.e., an upper surface 600 having a W-shaped profile. In exemplary embodiments, methods form gate structures with planar upper surfaces 600 in certain device areas, while in other device areas the method forms gate structures with surfaces having W-shaped profiles.

Figure 7:
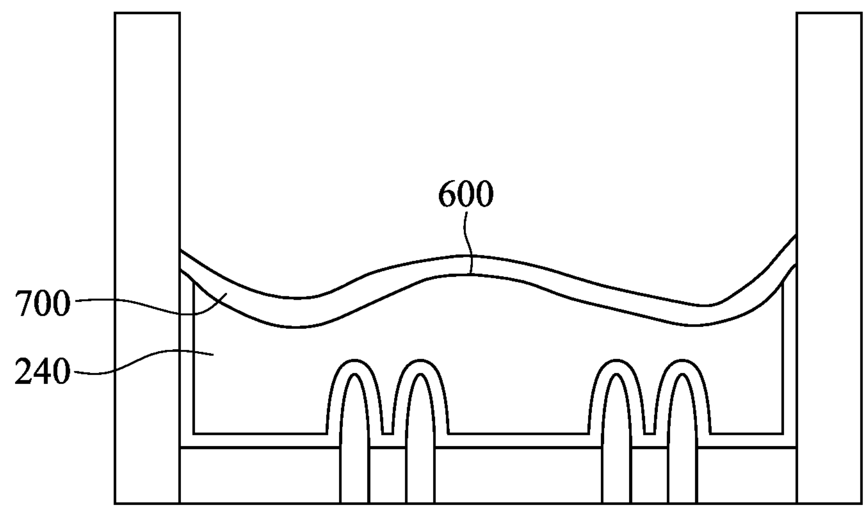

After establishing the desired profile of the upper surface 600, method 100 may continue at action block S112 with forming a liner 700 over the upper surface 600 of the gate structure 240, as shown in FIG. 7. An exemplary liner 700 is conductive, such as a metal. In exemplary embodiments, the liner 700 is tungsten. The liner 700 may be formed using ionized physical vapor deposition (ionized PVD), although other suitable deposition processes and thicknesses may be used. As shown the exemplary liner 700 is conformal and is formed with a generally constant thickness. In exemplary embodiments, the gate structure 240 may be considered to include the gate dielectric 241, the gate metal 242, and the liner 700.

Figure 8:
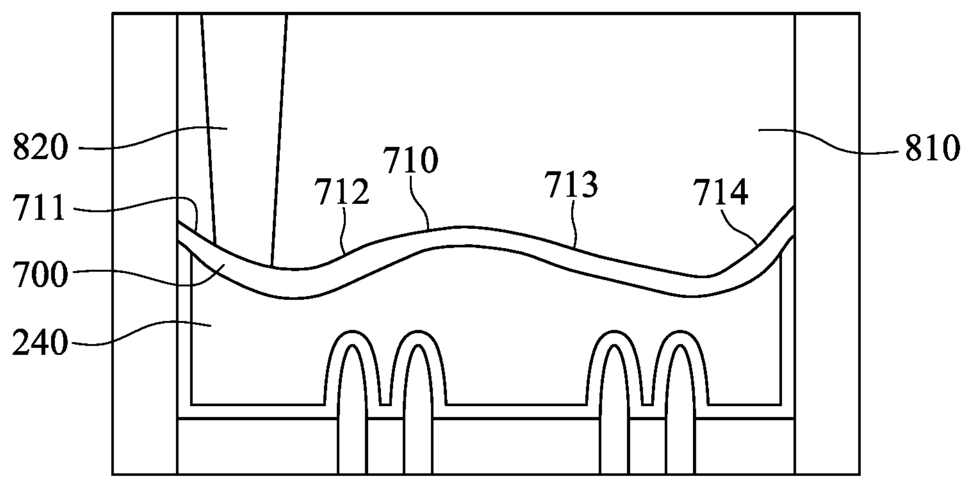

Method 100 continues at block S114 with forming dielectric material 810 over the liner 700, as shown in FIG. 8. An exemplary dielectric material 810 is SiN, though any suitable dielectric may be used. The dielectric material 810 may be deposited by a re-fill process.

Method 100 further includes, at block S116, forming an interconnect 820 in electrical contact with the liner 700, as shown in FIG. 8. An exemplary interconnect 820 is a conductive material such as a metal, for example cobalt, aluminum, copper, or other suitable material.

Method 100 may continue at block S118 with further processing of the device 200. Generally, the further processing may form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including cobalt, aluminum, copper, tungsten, and/or silicide. Moreover, additional process steps may be implemented before, during, and after method 100, and some process steps described above may be replaced or eliminated in accordance with various embodiments of method 100.

As shown in FIG. 8, the liner 700 has a sloped top surface 710. More specifically, the top surface 710 includes a first negative slope region 711, a first positive slope region 712, a second negative slope region 713, and a second positive slope region 714.

Figure 9:
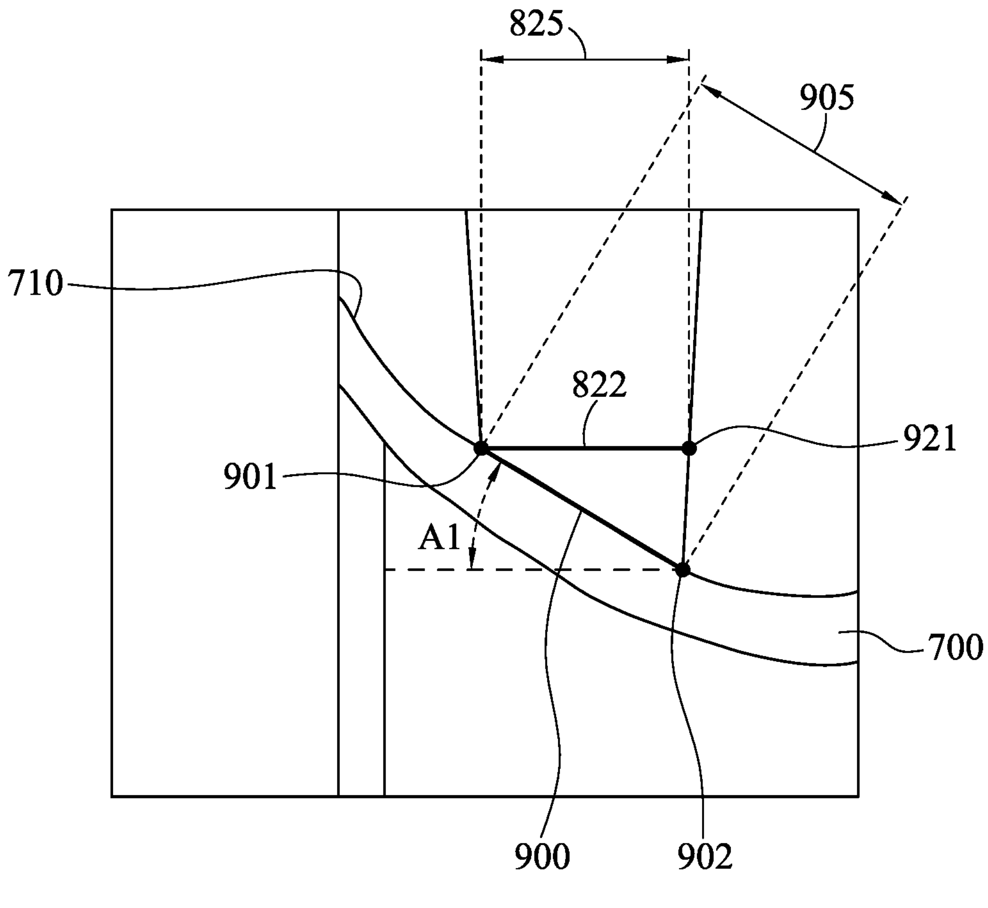
FIG. 9 is a focused cross-sectional view of an interface between an interconnect and a sloped surface of the structure of FIG. 8, in accordance with some embodiments.

FIG. 9 is a focused view of the interface 900 between the interconnect 820 and the liner 700. Cross-referencing FIG. 8 with FIG. 9, an angle A1 of the first negative slope section 711 and of the interface 900, relative to a horizontal plane, such as of an underlying substrate, is identified. In exemplary embodiments, the angle A1 is from 5 to 45 degrees.

In exemplary embodiments, the corresponding absolute vale of the angle of each slope section 712, 713, and 714 may be from 5 to 45 degrees. In exemplary embodiments, the difference in the angles between sections 711, 712, 713, and 714 is from 0 to 20 degrees.

It is further noted that dimensions and ratios of dimension may differ depending on the cross-sectional width of the gate. For a small gate, having a critical dimension or width in the Y-direction of about 50 nm, the angle A1 may be increased as compared to a large gate, having a critical dimension or width in the Y-direction of about 600 nm. For example, angle A1 (and other slopes) may be higher in a small gate by about 10 to 30 degrees, as compared to the angle A1 (and other slopes) in a large gate.

In exemplary embodiments, the interconnect 820 is formed in contact with the sloped region 711 of the top surface 710 of the liner 700. As a result, the contact interface 900 between the interconnect 820 and the liner 700 (and of the gate structure 240) extends from an upper end 901 to a lower end 902. Thus, the contact interface 900 has an interface length 905 that is greater than or equal to the distance between the upper end 901 and the lower end 902. Further, the contact interface 900 has an interface area that is a product of the interface length.

Further, the interconnect 820 has a horizontal cross-section 822 defined at the upper end 901 of the contact interface 900. The horizontal cross-section 822 extends a cross-sectional distance 825 from the upper end 901 to a location 821 at the same height and on the opposite edge of the interconnect 820, and has an interconnect cross-sectional area which is a product of the cross-sectional distance 825.

In exemplary embodiments, the interface length 905 is greater than the cross-sectional distance 825, and the contact interface area is greater than the interconnect cross-sectional area. In such embodiments, the contact interface area is about 1.05 to about 1.4 times greater than the interconnect cross-sectional area. As a result of the enlarged contact interface area, contact resistance (Rc) may be reduced. Further, the reduction in contact resistance (Rc) may be obtained even with a reduction in cross-sectional distance 825 as device size is reduced.

Figure 10:
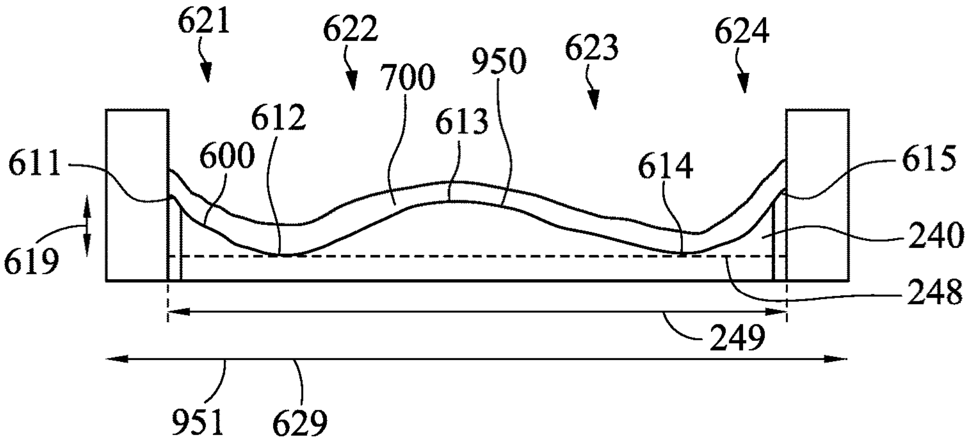
FIG. 10 is a focused cross-sectional view of an interface between the gate material and the liner of FIG. 7, in accordance with some embodiments.

Cross-referencing FIG. 8 with FIG. 10, a focused view of the interface 950 between the liner 700 and the upper surface 600 of the gate structure 240 (including the gate material 242 and layer 241) is provided. As shown, the upper surface 600 is sloped and includes first negative sloped region 621, first positive sloped region 622, second negative sloped region 623, and second positive sloped region 624. In more detail, the upper surface 600 extends from an initial highest point at end 611 at the left edge to an initial lowest point at trough 612, to a next highest point at crest 613, to a next lowest point at trough 614, to a next highest point at end 615 at the right edge, such that a surface length 629 from end 611 to end 615 is defined. In exemplary embodiments, the liner 700 covers the entire upper surface 600 of the gate structure 240. Thus, the interface 950 has an interface length 951 equal to the surface length 629 and has an interface area that is a product of the length 951.

The gate structure 240 includes a horizontal cross section 248 at the troughs 612 and/or 614 of the sloped upper surface 600. The horizontal cross section 248 has a length 249. In exemplary embodiments, the length 249 is from 80 to 120 nanometers (nm). A cross-sectional area of the gate is defined as a product of the length 249.

In exemplary embodiments, gate interface length 951 is greater than cross-section length 249, and the gate interface area is greater than the cross-sectional area. In exemplary embodiments, the gate interface area is about 1.05 to about 1.4 times greater than the cross-sectional area.

In FIG. 10, the end 611 and/or 615 of the upper surface 600 is formed at a maximum vertical distance or height 619 (equal to ΔD23 described above) over the trough 612 and/or trough 614. Height 619 may be from −5 to 25 nm. Thus, in certain embodiments, the maximum ratio of height 619 to length 249 is from 25:80 to 25:120.

Figure 11:
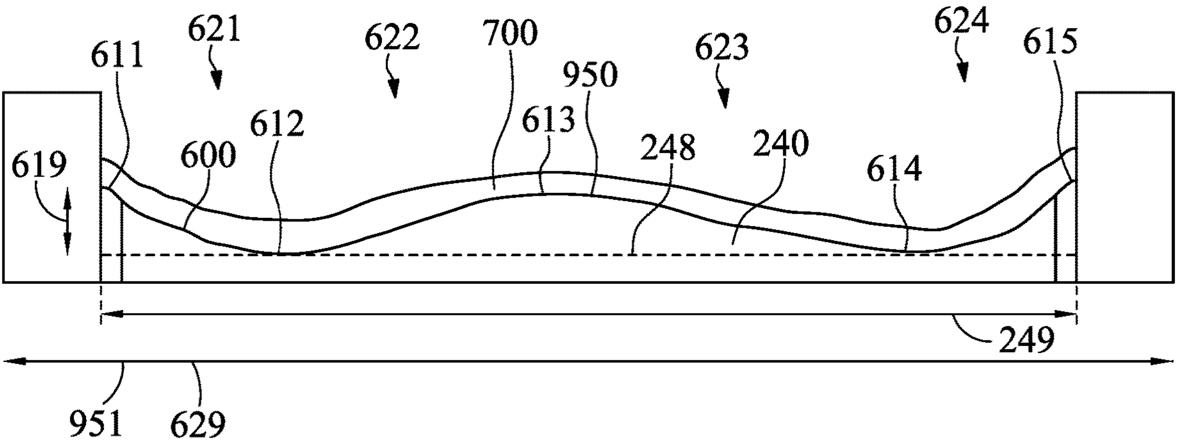
FIG. 11 is a focused cross-sectional view of an interface between the gate material and the liner, similar to FIG. 10, but with a larger gate critical dimension, in accordance with some embodiments.
Figure 12:
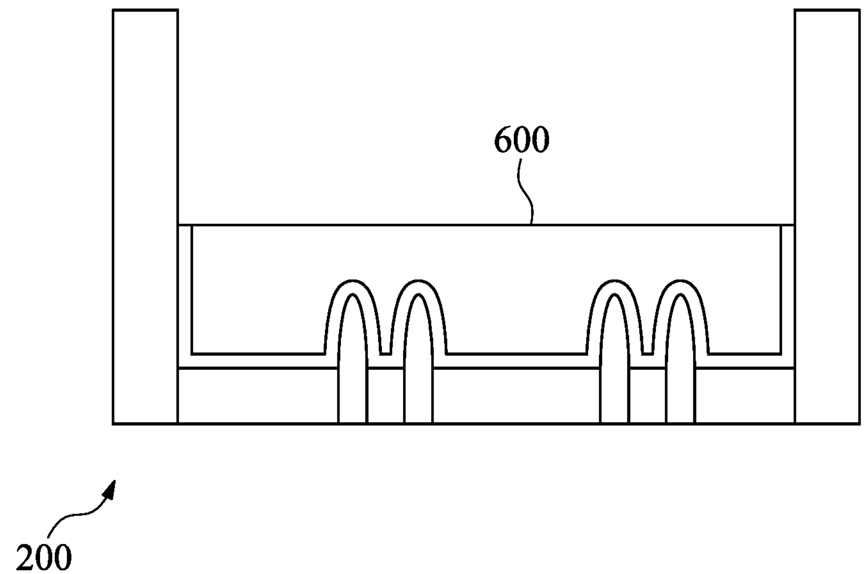
FIGS. 12-14 are cross-sectional views illustrating alternative processing of the structure of FIG. 5, in accordance with some embodiments.

FIG. 11 is a focused cross-sectional view of the interface 950 between the liner 700 and the upper surface 600 of the gate structure 240 (including the gate material 242 and layer 241), similar to FIG. 10, but in embodiments having a larger gate critical dimension, such as 600 nanometers (nm). As shown in FIG. 12, the upper surface 600 is sloped and includes first negative sloped region 621, first positive sloped region 622, second negative sloped region 623, and second positive sloped region 624. In more detail, the upper surface 600 extends from an initial highest point at end 611 at the left edge to an initial lowest point at trough 612, to a next highest point at crest 613, to a next lowest point at trough 614, to a next highest point at end 615 at the right edge, such that a surface length 629 from end 611 to end 615 is defined. In exemplary embodiments, the liner 700 covers the entire upper surface 600 of the gate structure 240. Thus, the interface 950 has an interface length 951 equal to the surface length 629 and has an interface area that is a product of the length 951.

The gate structure 240 includes a horizontal cross section 248 at the troughs 612 and/or 614 of the sloped upper surface 600. The horizontal cross section 248 has a length 249. In exemplary embodiments, the length 249 is 600 nanometers (nm). A cross-sectional area of the gate is defined as a product of the length 249.

In exemplary embodiments, gate interface length 951 is greater than cross-section length 249, and the gate interface area is greater than the cross-sectional area. In exemplary embodiments, the gate interface area is about 1.05 to about 1.4 times greater than the cross-sectional area.

In FIG. 11, the end 611 and/or 615 of the upper surface 600 is formed at a maximum vertical distance or height 619 (equal to ΔD23 described above) over the trough 612 and/or trough 614. Height 619 may be from −5 to 25 nm. Thus, in certain embodiments, the maximum ratio of height 619 to length 249 is 25:600.

Figure 13:
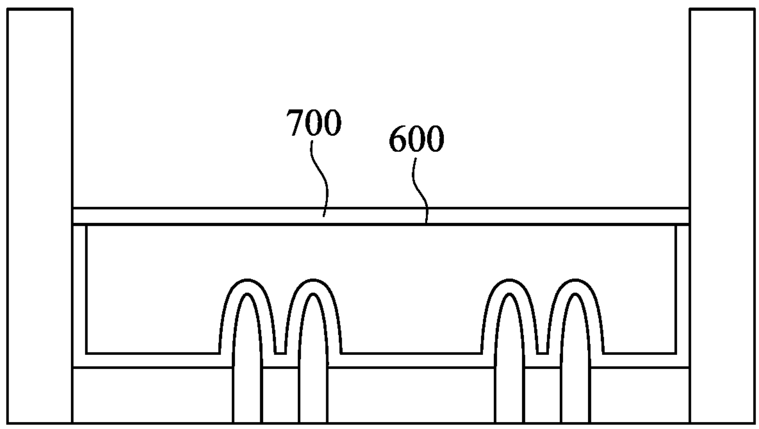
Figure 14:
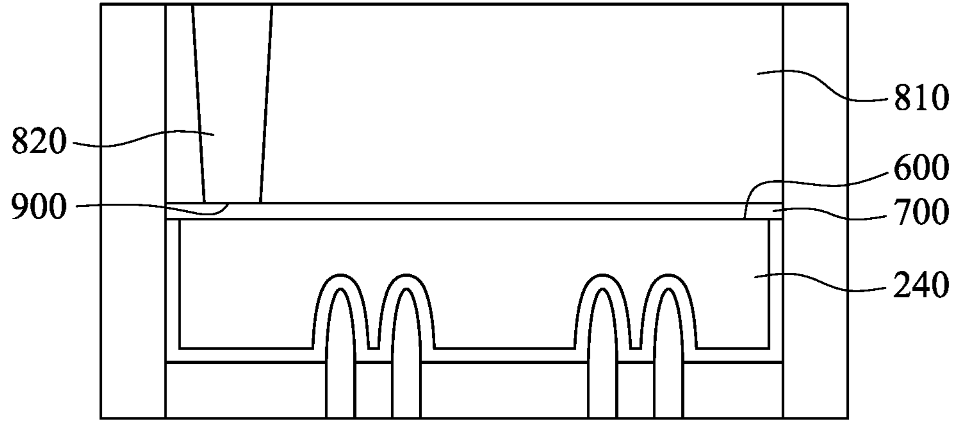

Referring to FIGS. 12-14, an alternative embodiment of the second etching process is illustrated. Specifically, from FIG. 5, the second etching process is performed for a relative long duration, resulting in the elimination of the horns 252 and 253 and recessing the surface to a plane, as shown in FIG. 12. Specifically, the upper surface 600 is formed as a substantially planar surface, i.e., non-sloping. With the elimination of the horns 252 and 253, there is more gate metal loss, and a lower threshold voltage for a PMOS device, but a higher threshold voltage for an NMOS device.

As may be understood from comparing FIGS. 4 and 12, the second etching process may be controlled to provide any desired recessed surface profile, depending on the duration of the second etch and the etch-retarding layer composition and dimensions.

In FIG. 13, the liner 700 is formed over the non-sloping upper surface 600. In FIG. 14, dielectric material 810 is formed over the liner 700, and an interconnect 820 is formed in electrical contact with the liner 700. An exemplary interconnect 820 is a conductive material such as a metal, for example cobalt, aluminum, copper, or other suitable material.

As the upper surface of FIGS. 12-14 is planar and non-sloping, the interface area between the gate structure 240 and the liner 700 and the cross-sectional area of the gate structure 240 are substantially equal. Likewise, the contact interface 900 between the interconnect 820 and the liner 700 has an area that is substantially equal to the cross-sectional area of the interconnect 820 adjacent the interface 900.

Cross-referencing FIGS. 6 and 12, it may be understood that for exemplary embodiments of an upper surface 600 having a planar profile, heights D1, D2, D3, D4 and D5 are the same and are from 5 to 30 nm, and height differentials ΔD14, ΔD24, ΔD43, ΔD13, and ΔD23 are zero.

In certain embodiments, method 100 may include depositing the etch-retarding layer 500 at S108 with different process parameters in different areas of a substrate or device such that an etch-retarding layer is formed with a first maximum thickness in a first area and an etch-retarding layer is formed with a second maximum thickness different from the first maximum thickness in a second area. For example, the deposition process may be performed for a first deposition time or duration in the first area and for a second deposition time or duration in the second area. When the second deposition time is greater than the first deposition time, then the second maximum thickness is greater than the first maximum thickness.

Further, method 100 may include performing the second etch process with different parameters in different areas of the substrate or device. For example, the second etch process may be performed for a first process time or duration in the first area and for a second process time or duration in the second area. Generally, the longer the process time, the more gate material is removed during the second etch process. For example, the second etch process may form one area of the device with the structure of FIG. 6, and another area of the device with the structure of FIG. 12, and/or any other area of the device with any desired profile considered to be a combination of the structure of FIGS. 6 and 12. Thus, the method 100 provides a tunable mechanism for forming structures with desired properties.

In exemplary embodiments, a method is provided and includes performing a first etch process to differentially etch a gate material to a recessed surface, wherein the recessed surface includes a first horn, a second horn, and a valley located between the first horn and the second horn, and wherein the valley includes a first section adjacent to the first horn, a second section adjacent to the second horn, and a middle section between the first section and the second section; depositing an etch-retarding layer over the recessed surface, wherein the etch-retarding layer comprises a first edge region, a second edge region, and a central region between the first edge region and the second edge region, wherein the first edge region is located over the first horn and the first section, wherein the second edge region is located over the second horn and the second section, wherein the central region is located over the middle section, and wherein the central region is thicker than the first edge region and the second edge region; and performing a second etch process to recess the gate material to establish the gate material with a W-shaped profile.

In exemplary embodiments of the method, the etch-retarding layer is formed with an upper surface having a first negative slope extending from a first end to a first trough, a first positive slope extending from the first trough to a crest, a second negative slope from the crest to a second trough, and a second positive slope extending from the second trough to a second end.

In exemplary embodiments, the method further includes forming a liner over the W-shaped profile of the gate material, wherein the gate material and the liner form a gate; forming a dielectric material over the gate; and forming an interconnect in contact with the gate.

In exemplary embodiments of the method, the etch-retarding layer comprises carbon, boron, or carbon and boron.

In exemplary embodiments, the method further includes determining a desired threshold voltage for the gate material, wherein the W-shaped profile of the gate material is selected based on the desired threshold voltage; and wherein the second etch process is performed for a selected time to establish the gate material with the W-shaped profile.

In exemplary embodiments, the method further includes forming a liner over the W-shaped profile of the gate material, wherein the gate material and the liner form a gate; wherein the W-shaped profile of the gate material comprises a sloped upper surface having a lowest point; wherein the liner contacts the sloped upper surface along a gate interface having a gate interface area; wherein a horizontal cross section of the gate material at the lowest point of the sloped upper surface has a cross-sectional area; and wherein the gate interface area is greater than the cross-sectional area. In such embodiments, the gate interface area may be about 1.05 to about 1.4 times greater than the cross-sectional area.

In exemplary embodiments, the method further includes forming a liner over the W-shaped profile of the gate material, wherein the liner has a sloped top surface; and forming an interconnect in contact with the sloped top surface of the liner at a contact interface extending from an upper end to a lower end and defining a contact interface area; wherein a horizontal cross-section of the interconnect at the upper end of the contact interface has an interconnect cross-sectional area, and wherein the contact interface area is greater than the interconnect cross-sectional area. In such embodiments, the contact interface area may be about 1.05 to about 1.4 times greater than the interconnect cross-sectional area.

In another embodiment, a method is provided and includes providing a semiconductor structure having a first area and a second area; performing a deposition process to deposit an etch-retarding layer over a metal gate material in the first area and in the second area, wherein: the deposition process is performed for a first deposition time in the first area to form the etch-retarding layer with a first maximum thickness; the deposition process is performed for a second deposition time in the second area to form the etch-retarding layer with a second maximum thickness; the second deposition time is greater than the first deposition time; and the second maximum thickness is greater than the first maximum thickness; and performing an etch process to remove the etch-retarding layer and recess the metal gate material, wherein the etch process is performed for a first etch time in the first area to form the metal gate material in the first area with a W-shaped profile.

In exemplary embodiments of the method, the etch process is performed for a second etch time, greater than the first etch time, in the second area to form the metal gate material in the second area with a substantially planar profile.

In exemplary embodiments of the method, the etch-retarding layer comprises carbon, boron, or carbon and boron.

In exemplary embodiments of the method, the etch process is a second etch process, and the method further comprises performing a first etch process to differentially etch the metal gate material to a recessed surface, wherein the recessed surface includes a first horn, a second horn, and valley located between the first horn and the second horn.

In exemplary embodiments of the method, the valley includes a first section adjacent to the first horn, a second section adjacent to the second horn, and a middle section between the first section and the second section; and each maximum thickness is located over a respective middle section.

In exemplary embodiments, the method further includes forming a metal liner over the metal gate material in each area, wherein the metal gate material and the metal liner form a metal gate in each area; wherein the metal liner contacts the W-shaped profile of the metal gate material along a gate interface having a gate interface area; wherein a horizontal cross section of the metal gate material at a lowest point of the W-shaped profile has a cross-sectional area; and wherein the gate interface area is greater than the cross-sectional area.

In exemplary embodiments of the method, after the etch process, the metal gate material in the first area comprises a first horn, a first valley, a middle peak, a second valley, and a second horn, wherein the middle peak has a maximum height that is less than a maximum height of the first horn and the second horn.

A semiconductor structure is provided in certain embodiments. The semiconductor structure includes an active region and a conductive gate overlying the active region and including a plug having an upper surface with a W-shaped profile and defining a lowest point; and a liner overlying the upper surface, wherein the liner contacts the plug along a gate interface having a gate interface area, wherein a horizontal cross section of the plug at the lowest point of the upper surface has a plug cross-sectional area, and wherein the gate interface area is greater than the plug cross-sectional area.

In exemplary embodiments of the structure, the gate interface area is about 1.05 to about 1.4 times greater than the plug cross-sectional area.

In exemplary embodiments of the structure, the liner has a top surface with a W-shaped profile, and the semiconductor structure further includes a conductive interconnect in direct contact with the top surface at a contact interface extending from an upper end to a lower end and defining a contact interface area, wherein a horizontal cross-section of the conductive interconnect at the upper end of the contact interface has an interconnect cross-sectional area, and wherein the contact interface area is greater than the interconnect cross-sectional area. In such embodiments, the contact interface area may be about 1.05 to about 1.4 times greater than the interconnect cross-sectional area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:

performing a first etch process to differentially etch a gate material to a recessed surface, wherein the recessed surface includes a first horn, a second horn, and a valley located between the first horn and the second horn, and wherein the valley includes a first section adjacent to the first horn, a second section adjacent to the second horn, and a middle section between the first section and the second section;

depositing an etch-retarding layer over the recessed surface, wherein the etch-retarding layer comprises carbon, boron, or carbon and boron, wherein the etch-retarding layer comprises a first edge region, a second edge region, and a central region between the first edge region and the second edge region, wherein the first edge region is located over the first horn and the first section, wherein the second edge region is located over the second horn and the second section, wherein the central region is located over the middle section, and wherein the central region is thicker than the first edge region and the second edge region; and performing a second etch process to recess the gate material to establish the gate material with a W-shaped profile.

2. The method of claim 1, wherein the etch-retarding layer is formed with an upper surface having a first negative slope extending from a first end to a first trough, a first positive slope extending from the first trough to a crest, a second negative slope from the crest to a second trough, and a second positive slope extending from the second trough to a second end.

3. The method of claim 1, further comprising:

forming a liner over the W-shaped profile of the gate material, wherein the gate material and the liner form a gate;

forming a dielectric material over the gate; and forming an interconnect in contact with the gate.

4. The method of claim 1, further comprising determining a desired threshold voltage for the gate material, wherein the W-shaped profile of the gate material is selected based on the desired threshold voltage; and wherein the second etch process is performed for a selected time to establish the gate material with the W-shaped profile.

5. The method of claim 1, further comprising:

forming a liner over the W-shaped profile of the gate material, wherein the gate material and the liner form a gate;

wherein the W-shaped profile of the gate material comprises a sloped upper surface having a lowest point;

wherein the liner contacts the sloped upper surface along a gate interface having a gate interface area;

wherein a horizontal cross section of the gate material at the lowest point of the sloped upper surface has a cross-sectional area; and wherein the gate interface area is greater than the cross-sectional area.

6. The method of claim 5, wherein the gate interface area is about 1.05 to about 1.4 times greater than the cross-sectional area.

7. The method of claim 1, further comprising:

forming a liner over the W-shaped profile of the gate material, wherein the liner has a sloped top surface; and forming an interconnect in contact with the sloped top surface of the liner at a contact interface extending from an upper end to a lower end and defining a contact interface area; wherein a horizontal cross-section of the interconnect at the upper end of the contact interface has an interconnect cross-sectional area, and wherein the contact interface area is greater than the interconnect cross-sectional area.

8. The method of claim 7, wherein the contact interface area is about 1.05 to about 1.4 times greater than the interconnect cross-sectional area.

9. A method comprising:

providing a semiconductor structure having a first area and a second area;

performing a deposition process to deposit an etch-retarding layer over a metal gate material in the first area and in the second area, wherein:

the deposition process is performed for a first deposition time in the first area to form the etch-retarding layer with a first maximum thickness;

the deposition process is performed for a second deposition time in the second area to form the etch-retarding layer with a second maximum thickness;

the second deposition time is greater than the first deposition time; and the second maximum thickness is greater than the first maximum thickness; and performing an etch process to remove the etch-retarding layer and recess the metal gate material, wherein the etch process is performed for a first etch time in the first area to form the metal gate material in the first area with a W-shaped profile.

10. The method of claim 9 wherein the etch-retarding layer comprises carbon, boron, or carbon and boron.

11. The method of claim 9, wherein the etch process is performed for a second etch time, greater than the first etch time, in the second area to form the metal gate material in the second area with a substantially planar profile.

12. The method of claim 9, wherein the etch-retarding layer comprises carbon, boron, or carbon and boron.

13. The method of claim 9, wherein the etch process is a second etch process, and wherein the method further comprises performing a first etch process to differentially etch the metal gate material to a recessed surface, wherein the recessed surface includes a first horn, a second horn, and valley located between the first horn and the second horn.

14. The method of claim 13, wherein:

the valley includes a first section adjacent to the first horn, a second section adjacent to the second horn, and a middle section between the first section and the second section; and each maximum thickness is located over a respective middle section.

15. The method of claim 9, further comprising:

forming a metal liner over the metal gate material in each area, wherein the metal gate material and the metal liner form a metal gate in each area;

wherein the metal liner contacts the W-shaped profile of the metal gate material along a gate interface having a gate interface area;

wherein a horizontal cross section of the metal gate material at a lowest point of the W-shaped profile has a cross-sectional area; and wherein the gate interface area is greater than the cross-sectional area.

16. The method of claim 15, wherein, after the etch process, the metal gate material in the first area comprises a first horn, a first valley, a middle peak, a second valley, and a second horn, wherein the middle peak has a maximum height that is less than a maximum height of the first horn and the second horn.

17. A method comprising:

forming a conductive gate plug overlying an active region of a semiconductor substrate, wherein the conductive plug includes a first material forming an upper surface of the conductive gate plug;

processing the upper surface of the conductive gate plug to form the upper surface of the conductive gate plug with a W-shaped profile having at least one lowest point, wherein after the processing, the W-shaped profile is formed by the first material; and forming a liner overlying the W-shaped profile, wherein the liner contacts the conductive gate plug along a gate interface;

wherein the gate interface has a gate interface area that is greater than a plug cross-sectional area defined by a horizontal cross section of the conductive gate plug at the at least one lowest point.

18. The method of claim 17, further comprising forming a conductive interconnect in direct contact with a top surface of the liner, wherein the top surface has a W-shaped profile, and wherein the conductive interconnect contacts the top surface at a contact interface extending from an upper end to a lower end and defining a contact interface area that is greater than an interconnect cross-sectional area defined by a horizontal cross-section of the conductive interconnect at the upper end.

19. The method of claim 17, wherein:

before the processing, the upper surface has an uppermost point at a first height over the active region; and after the processing, the upper surface has an uppermost point at a second height over the active region, wherein the second height is not greater than the first height.

20. The method of claim 17, wherein the W-shaped profile includes a first horn at a first edge of the conductive gate plug, a second horn at a second edge of the conductive gate plug, a first valley between the first horn and a middle peak, and a second valley between the middle peak and the second horn, wherein the middle peak has a height less than a height of the first horn and the second horn.

* * * * *